United States Patent
MacKenzie et al.

(10) Patent No.: US 11,984,524 B2
(45) Date of Patent: May 14, 2024

(54) DIAMOND GAMMAVOLTAIC CELL

(71) Applicant: The University of Bristol, Bristol (GB)

(72) Inventors: Gordon Robson MacKenzie, Cardiff (GB); Thomas Bligh Scott, Bristol (GB); Neil Anthony Fox, Cheltenham (GB); Chris Hutson, North Somerset (GB)

(73) Assignee: The University of Bristol, Bristol (GB)

( * ) Notice: Subject to any disclaimer, the term of this patent is extended or adjusted under 35 U.S.C. 154(b) by 0 days.

(21) Appl. No.: 17/674,384

(22) Filed: Feb. 17, 2022

(65) Prior Publication Data

US 2023/0261131 A1    Aug. 17, 2023

(51) Int. Cl.
*H01L 31/08*    (2006.01)
*H01L 31/118*    (2006.01)

(52) U.S. Cl.
CPC .......... *H01L 31/085* (2013.01); *H01L 31/118* (2013.01)

(58) Field of Classification Search
CPC ....... H01L 31/085; H01L 31/118; G21H 1/02; G21H 1/04; G21H 1/06
See application file for complete search history.

(56) References Cited

U.S. PATENT DOCUMENTS

| | | | | |
|---|---|---|---|---|
| 2010/0233518 A1* | 9/2010 | Kwon | ...................... | G21H 1/00 429/7 |
| 2012/0055532 A1* | 3/2012 | Wang | .................. | H01L 25/0753 257/E33.064 |
| 2017/0358377 A1* | 12/2017 | Cabauy | ..................... | G21H 1/06 |

FOREIGN PATENT DOCUMENTS

| WO | 2018158591 A1 | 9/2018 | |
|---|---|---|---|
| WO | WO-2021236067 A1 * | 11/2021 | ............... G21H 1/04 |

OTHER PUBLICATIONS

Liu et al, "Alpha-voltaic battery on diamond Schottky barrier diode", Diam. Relat. Mater. 87 (2018) 35-42.
Bormashov et al, "Development of nuclear microbattery prototype based on Schottky barrier diamond diodes", Phys. Status Solidi Appl. Mater. Sci. 212 (2015) 2539-2547.
K. Scharf, Photovoltaic Effect Produced in Silicon Solar Cells by x-and Gamma Rays J, J. Res. Natl. Bur. Stand. A. Phys. Chem. 64 (1960) 297-307.
K. Hashizume, H. Kimura, T. Otsuka, T. Tanabe, T. Okai, Direct Energy Conversion From Gamma Ray to Electricity Using Silicon Semiconductor Cells, MRS Proc. 1264 (2010) 1264-BB05-01.
N. Horiuchi, K. Taniguchi, M. Kamiki, T. Kondo, M. Aritomi, The characteristics of solar cells exposed to γ-radiation, Nucl. Instruments Methods Phys. Res. Sect. A Accel. Spectrometers, Detect. Assoc. Equip. 385 (1997) 183-188.
J.R. White, D. Kinsman, T.M. Regan, L.M. Bobek, Novel Nuclear Powered Photocatalytic Energy Conversion, 2005.

(Continued)

*Primary Examiner* — Tamir Ayad
(74) *Attorney, Agent, or Firm* — Vorys, Sater, Seymour and Pease, LLP

(57) ABSTRACT

Provided herein is a diamond gammavoltaic cell comprising: a diamond body having a diamond body surface including first and second opposing surfaces; a low-barrier electrical contact formed on the first surface; and a high-barrier electrical contact formed on the second surface, wherein the diamond body surface that is not in contact with either the low-barrier electrical contact or the high-barrier electrical contact is at least partially surface transfer doped to provide a p-type surface.

17 Claims, 8 Drawing Sheets

(56) References Cited

OTHER PUBLICATIONS

B. Náfrádi, G. Náfrádi, F. László, L. Lászlóforró,, E. Horváth, Methylammonium Lead Iodide for Efficient X-ray Energy Conversion, J. Phys. Chem. C. 119 (2015) 25204-25208.

Yan et al., "Quantitative study on graphitization and optical absorption of CVD diamond films after rapid heating treatment", Diamond and Related Materials, Apr. 14, 2018.

Taki et al., "XPS structural characterization of hydrogenated amorphous carbon thin films prepared by shielded arc ion plating", Thin Solid Films, vol. 316, Issues 1-2, Mar. 21, 1998, pp. 45-50.

Frank et al., in "Determination of thermal conductivity and specific heat by a combined 3ω/decay technique", Review of Scientific Instruments 64, 760 (1993).

Wan et al. in "Electronic Structure Tunability of Diamonds by Surface Functionalization" J. Phys. Chem. C 2019, 123, 7, 4168-4177.

Mackenzie et al., "A diamond gammavoltaic cell utilizing surface conductivity and its response to different photon interaction mechanisms", Materials Today Energy 21 (2021).

Hutson, C. (Jul. 1, 2018). Diamond-based dosimetry for measurements in highly radioactive environments.

\* cited by examiner

DIAMOND GAMMAVOLTAIC CELL

FIELD OF INVENTION

The present disclosure is directed to diamond gammavoltaic cells, methods for producing diamond gammavoltaic cells, and methods for generating electrical power.

The field of photovoltaics is often considered to describe solar photovoltaics. However, similar effects can be produced for photon energies outside of the visible range. The present disclosure investigates the potential of photovoltaics for much higher photon energies (such as x-rays and gamma rays): gammavoltaics.

BACKGROUND

Various device structures and materials have been developed to extract electrical energy from nuclear sources. In alphavoltaic (see, for example, Liu et al, "Alpha-voltaic battery on diamond Schottky barrier diode", Diam. Relat. Mater. 87 (2018) 35-42) and betavoltaic devices (see, for example, Bormashov et al, "Development of nuclear microbattery prototype based on Schottky barrier diamond diodes", Phys. Status Solidi Appl. Mater. Sci. 212 (2015) 2539-2547) electricity is generated under illumination from alpha and beta particles respectively. Alphavoltaic and betavoltaic devices are often intended for use as portable micropower devices, with incorporated radioisotope sources.

Due to the shielding requirements of gamma isotopes, gammavoltaic devices may be suited to deployment into existing gamma fields rather than isotopes being incorporated into the device as with alphavoltaic and betavoltaic devices. This can represent an advantage in not needing to source or handle isotopes during the creation of gammavoltaic devices. A gammavoltaic device may be made, and then brought to the often-substantial high-energy photon source. In nuclear waste stores, for example, where simple measurements of temperature and humidity are desired (i.e., measurements with low power requirements), ambient gamma dose rates are around 100 Gy/h and cannister surface dose rates are estimated to be as high as 1,200 Gy/h. In such places, micropower sensors would provide much greater information density about the interior, and hence lower the risk of the store. As such, as for other radiovoltaics, it is desirable to produce gammavoltaics producing at least micropower outputs.

Previous attempts at producing gammavoltaic cells have employed silicon photovoltaic cells, either as direct conversion devices (see, for example, K. Scharf, Photovoltaic Effect Produced in Silicon Solar Cells by x- and Gamma Rays J, J. Res. Natl. Bur. Stand. A. Phys. Chem. 64 (1960) 297-307; and K. Hashizume, H. Kimura, T. Otsuka, T. Tanabe, T. Okai, Direct Energy Conversion From Gamma Ray to Electricity Using Silicon Semiconductor Cells, MRS Proc. 1264 (2010) 1264-BB05-01), or in tandem with scintillator layers (see, for example, N. Horiuchi, K. Taniguchi, M. Kamiki, T. Kondo, M. Aritomi, The characteristics of solar cells exposed to γ-radiation, Nucl. Instruments Methods Phys. Res. Sect. A Accel. Spectrometers, Detect. Assoc. Equip. 385 (1997) 183-188; and J. R. White, D. Kinsman, T. M. Regan, L. M. Bobek, Novel Nuclear Powered Photocatalytic Energy Conversion, 2005). Other approaches have used single crystal methylammonium lead triiodide (see, for example, B. Náfrádi, G. Náfrádi, F. László, L. Lászlóforró, E. Horváth, Methylammonium Lead Iodide for Efficient X-ray Energy Conversion, J. Phys. Chem. C. 119 (2015) 25204-25208). These previous attempts have encountered various problems including material degradation.

All previous radiovoltaics have used structures which are established within the larger field of semiconductor devices: Schottky junctions and p-n junctions. Most semiconductors suffer from radiation damage after exposure to high radiation doses, causing a rapid decrease on their performance leading eventually to device failure. This happens due the fragility of the atomic bonds of their crystal lattices that can be broken by the impinging radiation and cause the material to change its internal structure directly impacting the efficiency of devices.

Therefore, there is a need for an improved gammavoltaic device.

SUMMARY OF THE DISCLOSURE

Various details of the present disclosure are hereinafter summarized to provide a basic understanding. This summary is not an extensive overview of the disclosure and is intended neither to identify certain elements of the disclosure, nor to delineate the scope thereof. Rather, the primary purpose of this summary is to present some concepts of the disclosure in a simplified form prior to the more detailed description that is presented hereinafter.

High-energy photon fields are present in a range of circumstances, notably nuclear waste stores, active and inactive fission and fusion reactors and diverse regions of space such as the Van Allen belts. They can also be created by the presence of gamma-emitting isotopes, which may occur naturally or be created or concentrated. Presence of such fields often creates a safety concern, which in turn requires mitigating measures that may require electrical power, for example for sensing or actuation.

For example, the high-energy photon field created by high-level nuclear waste, stored in vitreous form in cannisters, may be above 1000 Gy/h, primarily composed of 662 keV photons emitted by $Cs^{-137}$, but also containing Co-60 emissions at 1.17 MeV and 1.34 MeV, amongst others. This is orders of magnitude greater than the lethal human dose rate and will destroy conventional electronics and power sources within a short time. Powering shielded sensor electronics using the gamma field itself is therefore an economical and safe solution to long-term monitoring of dangerous waste.

The present inventors have found that gammavoltaic cells, devices and systems as described herein can be produced to provide improved gammavoltaic cells, devices and systems that can be used in various applications, including the long-term monitoring of nuclear waste.

The term "gammavoltaic cell" is used herein to refer to a device that, under irradiation from high energy photons (for example, photons having energies in the range of 1 keV to 5 MeV), such as x-rays and gamma rays, produces electricity.

The present inventors have identified that diamond is a suitable material for use in the production of a gammavoltaic cell.

The term "diamond body" is used herein to refer to a material composed of diamond. The skilled person understands that diamond can be described as a crystalline material (a polycrystalline material or a single crystal material). The skilled person also understands that diamond can be described as the diamond allotrope of carbon in which carbon atoms are arranged in a cubic Bravais lattice over which is laid a four-atom tetrahedral motif.

The diamond of the diamond body may contain at least about 90% sp$^3$ bonds, for example at least about 95% sp$^3$ bonds, at least about 97% sp$^3$ bonds, at least about 98% sp$^3$ bonds, at least about 99% sp$^3$ bonds, at least about 99.5% sp$^3$ bonds, at least about 99.9% sp$^3$ bonds, or about 100% sp$^3$ bonds. The sp$^3$ bond content in the diamond body may be determined by methods known to the skilled person, for example using X-ray photoelectron spectroscopy (XPS) (for example, as described by Yan et al., "Quantitative study on graphitization and optical absorption of CVD diamond films after rapid heating treatment", Diamond and Related Materials, 14 Apr. 2018 (available online at https://doi.org/10.1016/j.diamond.2018.04.011); or Taki et al., "XPS structural characterization of hydrogenated amorphous carbon thin films prepared by shielded arc ion plating", Thin Solid Films, Volume 316, Issues 1-2, 21 Mar. 1998, Pages 45-50).

The skilled person understands that diamond may have a single active Raman mode at 1332 cm$^{-1}$.

The diamond of the diamond body may have a band gap at room temperature (about 25° C.) of greater than about 5.3 eV, or about 5.4 eV or greater, or about 5.5 eV.

The diamond of the diamond body may have a thermal conductivity measured at room temperature (about 25° C.) of greater than about 100 W/mK, for example, greater than about 500 W/mK, greater than about 1000 W/mK, greater than about 1500 W/mK, or greater than about 2000 W/mK, or about 2200 W/mK or greater. Thermal conductivity of diamond may be determined according to the 3ω method (as described by Frank et al., in "Determination of thermal conductivity and specific heat by a combined 3ω/decay technique", Review of Scientific Instruments 64, 760 (1993)).

The diamond of the diamond body may have a density of greater than about 3300 kg/m$^3$, for example greater than about 3400 kg/m$^3$, or greater than about 3500 kg/m$^3$.

According to a first aspect of the present disclosure, provided herein is a diamond gammavoltaic device comprising:
  a diamond body having a diamond body surface including first and second opposing surfaces;
  a low-barrier electrical contact formed on the first surface; and
  a high-barrier electrical contact formed on the second surface,
  wherein the diamond body surface that is not in contact with either the low-barrier electrical contact or the high-barrier electrical contact is at least partially surface transfer doped to provide a p-type surface.

According to a second aspect of the present disclosure, provided herein is a method for generating electricity, the method comprising:
  providing a diamond gammavoltaic device; and
  exposing the diamond gammavoltaic device to high-energy photons,
  wherein the diamond gammavoltaic device comprises:
    a diamond body having a diamond body surface including first and second opposing surfaces;
    a low-barrier electrical contact formed on the first surface; and
    a high-barrier electrical contact formed on the second surface,
    wherein the diamond body surface that is not in contact with either the low-barrier electrical contact or the high-barrier electrical contact is at least partially surface transfer doped.

According to a third aspect of the present disclosure, provided herein is a gammavoltaic system comprising a plurality of diamond gammavoltaic cells, each diamond gammavoltaic cell comprising:
  a diamond body having a diamond body surface including first and second opposing surfaces;
  a low-barrier electrical contact formed on the first surface; and
  a high-barrier electrical contact formed on the second surface,
  wherein the diamond body surface that is not in contact with either the low-barrier electrical contact or the high-barrier electrical contact is at least partially surface transfer doped.

BRIEF DESCRIPTION OF THE DRAWINGS

Embodiments of the present disclosure are described by way of example only with reference to the accompanying drawings in which.

DETAILED DESCRIPTION

Figure 1:
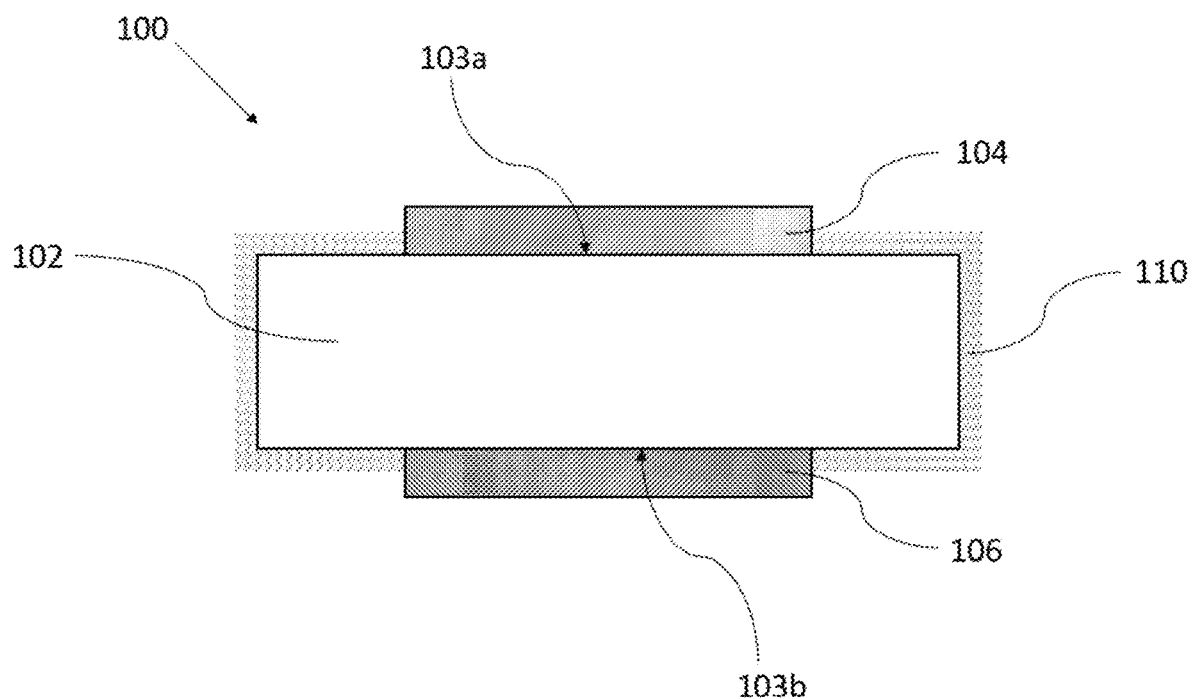
FIG. 1 is a diagram showing a cross-section view of a diamond gammavoltaic cell according to an aspect of the present disclosure.

Diamond Gammavoltaic (DGV) Cell/Device/System
Diamond Body

The DGV cell described herein comprises a diamond body having a diamond body surface including first and second opposing surfaces. The diamond body may be described as an insulating diamond body. The diamond body may be a planar diamond body in which the first and second opposing surface are oriented parallel to one another. In certain embodiments, the diamond body may be a monolithic diamond body. In certain embodiments, the diamond body may have high purity (i.e. the diamond body may have a boron and/or nitrogen content of less than $10^{16}$ at·cm$^{-3}$).

The gammavoltaic cell may comprise a commercial detector grade crystal diamond as the diamond body.

The diamond body may be a planar diamond body having a thickness of at least about 0.2 mm, for example a planar monolithic diamond body having a thickness of at least about 0.2 mm. In certain embodiments, the diamond body may be a planar diamond body having a thickness of about 0.5 mm.

Low-Barrier and High-Barrier Electrical Contacts

The DGV cell described herein comprises a diamond body having a diamond body surface including first and second opposing surfaces, with a low-barrier electrical contact formed on the first surface and a high barrier electrical contact formed on the second surface. The first and second opposing surfaces of the diamond body may be oriented parallel to one another.

The low-barrier electrical contact is formed over at least part of the first surface of the diamond body. The high-barrier electrical contact is formed over at least a part of the second surface of the diamond body.

The material of the low-barrier electrical contact and the material of the high-barrier electrical contact are selected to ensure a barrier asymmetry is provided across the DGV cell. For example, the electrostatic potential between the high-barrier electrical contact and the low-barrier electrical contact may be at least about 0.5 eV. In certain embodiments the electrostatic potential between the high-barrier electrical contact and the low-barrier electrical contact may be in the range of about 0.5 eV to about 5 eV, for example about 0.5 eV to about 2 eV.

In certain embodiments, the low-barrier electrical contact of the DGV cell is provided by applying a layer of metal on the first surface of the diamond body; and the high-barrier electrical contact the DGV cell is provided by applying a layer of metal on the second surface of the diamond body, wherein the metals provided to form the low-barrier electrical contact and the high-barrier electrical contact are different.

In certain embodiments, materials suitable to form the high-barrier contact include metals that are subject to fermi-level pinning on oxygenated surfaces. Examples of metals that are suitable to form the high-barrier contact include Zr, Al and Cr.

Examples of materials suitable to form the low-barrier contact include Ni, Co, Pd, Ir, NiCr and refractory metal carbides. An example of material combinations suitable to provide the high- and low-barrier electrical contacts include aluminum and NiCr.

In certain embodiments, the low- and/or high-barrier electrical contact is coated with a noble metal such as gold. Such a coating may be provided to prevent oxidation of the low- and/or high-barrier electrical contact.

Surface-Transfer Doped Surface

The DGV cell described herein comprises a diamond body having a diamond body surface including first and second opposing surfaces, with a low-barrier electrical contact formed on the first surface and a high barrier electrical contact formed on the second surface. The diamond body surface that is not in contact with either the low-barrier electrical contact or the high-barrier electrical contact is at least partially surface transfer doped to provide a p-type surface. In certain embodiments, the diamond body surface that is not in contact with either the low-barrier electrical contact or the high-barrier electrical contact is partially surface transfer doped to provide a p-type surface.

In certain embodiments, the diamond body surface that is surface transfer doped is hydrogen-terminated (which provides a p-type surface).

In certain embodiments, at least 5% of the diamond body surface that is not in contact with either the low-barrier electrical contact or the high-barrier electrical contact is surface transfer doped to provide a p-type surface, for example hydrogen-terminated. In certain embodiments, at least 10% of the diamond body surface that is not in contact with either the low-barrier electrical contact or the high-barrier electrical contact is surface transfer doped to provide a p-type surface, for example hydrogen-terminated. In certain embodiments, at least 20% of the diamond body surface that is not in contact with either the low-barrier electrical contact or the high-barrier electrical contact is surface transfer doped to provide a p-type surface, for example hydrogen-terminated. In certain embodiments, at least 30% of the diamond body surface that is not in contact with either the low-barrier electrical contact or the high-barrier electrical contact is surface transfer doped to provide a p-type surface, for example hydrogen-terminated.

In certain embodiments, the diamond body surface that is not in contact with either the low-barrier electrical contact or the high-barrier electrical contact is partially surface transfer doped to provide a p-type surface. In certain embodiments, up to about 99% or up to about 95% of the diamond body surface that is not in contact with either the low-barrier electrical contact or the high-barrier electrical contact is surface transfer doped to provide a p-type surface, for example hydrogen-terminated.

In certain embodiments, from about 5% to about 95% of the diamond body surface that is not in contact with either the low-barrier electrical contact or the high-barrier electrical contact is surface transfer doped to provide a p-type surface, for example hydrogen-terminated.

The extent to which the diamond body surface that is not in contact with either the low-barrier electrical contact or the high-barrier electrical contact is surface transfer doped to provide a p-type surface, for example hydrogen-terminated can be determined using X-ray photoemission spectroscopy.

Production of a DGV Cell

In certain embodiments, a DGV cell may be provided by a method comprising:
  providing a diamond body having a diamond body surface including first and second opposing surfaces;
  providing a low-barrier electrical contact on the first surface of the diamond body;
  providing a high-barrier electrical contact on the second surface of the treated diamond body; and
  partially surface transfer doping the diamond body surface that is not in contact with either the low-barrier electrical contact or the high-barrier electrical contact to provide a p-type surface.

In certain embodiments, during the production of a DGV cell, the surface of the diamond body is treated to provide an oxygen-terminated surface prior to forming the low- and high-barrier electrical contacts. In certain embodiments, treatment of the surface of the diamond body to provide an oxygen-terminated surface includes exposing the surface of the diamond body to a strong oxidizing agent (for example an oxygen plasma, or washing the diamond body in aqua regia).

In certain embodiments, a DGV cell may be provided by a method comprising:
  providing a diamond body having a diamond body surface including first and second opposing surfaces;
  treating the diamond body surface to provide an oxygen-terminated surface;
  providing a low-barrier electrical contact on the first surface of the treated diamond body;
  providing a high-barrier electrical contact on the second surface of the treated diamond body; and
  partially surface transfer doping the diamond body surface that is not in contact with either the low-barrier electrical contact or the high-barrier electrical contact to provide a p-type surface.

In certain embodiments, during the production of a DGV cell, the diamond body on which the low-barrier electrical contact and the high-barrier electrical contact are formed are exposed to a hydrogen plasma to provide at least partial hydrogen-termination on the diamond body surface that is not in contact with either the low-barrier electrical contact or the high-barrier electrical contact.

FIG. 1 provides a schematic diagram of a cross-section through a DGV cell 100 comprising a diamond body 102 having a first surface 103a and a second surface 103b with a low-barrier electrical contact 104 (for example NiCr) formed on the first surface 103a and a high-barrier electrical contact 106 (for example Al) formed on the second surface 103b. The diamond body surface that is not in contact with either the low-barrier electrical contact or the high-barrier electrical contact is at least partially surface transfer doped to provide a p-type surface 110 (for example, a hydrogen-terminated surface).

The low- and high-barrier electrical contacts 104, 106 may be applied to the first and second surfaces of the diamond body by any suitable method. For example, the low- and high-barrier electrical contacts 104, 106 may be applied to the first and second surfaces of the diamond body via physical vapor deposition (in some examples using resistive thermal evaporation, through shadow masks).

Figure 2:
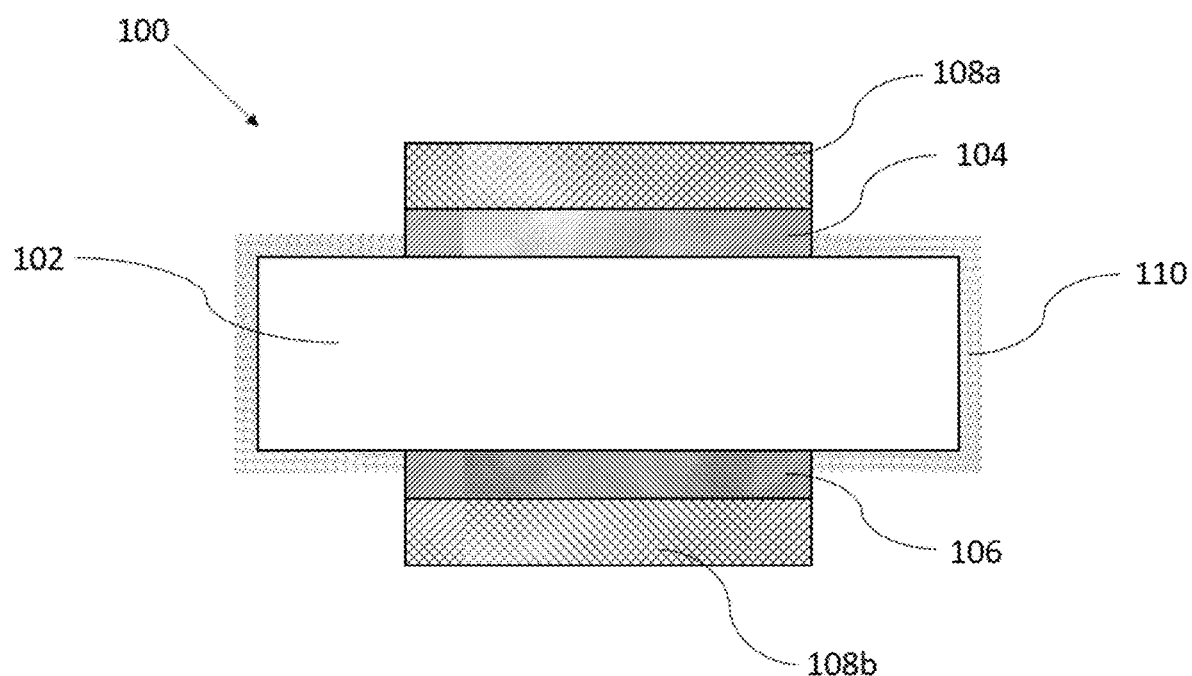
FIG. 2 is a diagram showing a cross-section view of a diamond gammavoltaic cell according to an aspect of the present disclosure.

FIG. 2 provides a schematic diagram of a cross-section through a DGV cell 100 comprising a diamond body 102 having a first surface 103a and a second surface 103b with a low-barrier electrical contact 104 (for example NiCr) formed on the first surface 103a and a high-barrier electrical contact 106 (for example Al) formed on the second surface 103b. The low-barrier electrical contact 104 and the high-barrier electrical contact 106 of the DGV cell 100 shown in FIG. 2 are coated with a noble metal layer 108a, 108b such as a gold layer. The diamond body surface that is not in contact with either the low-barrier electrical contact or the high-barrier electrical contact is at least partially surface transfer doped to provide a p-type surface 110 (for example, a hydrogen-terminated surface).

Surface-transfer doping of the diamond body surface that is not in contact with either the low-barrier electrical contact or the high-barrier electrical contact may be provided by exposing the DGV cell comprising the diamond body with the low- and high-barrier electrical contacts to a surface transfer doping plasma, for example to a hydrogen plasma. The extent to which the diamond body surface is surface transfer doped, for example hydrogen-terminated may be determined using X-ray photoemission spectroscopy (for example, as described by Wan et al. in "Electronic Structure Tunability of Diamonds by Surface Functionalization" J. Phys. Chem. C 2019, 123, 7, 4168-4177).

Diamond Gammavoltaic System

A diamond gammavoltaic system may comprise a plurality of DGV cells as described herein. The DGV cells of the diamond gammavoltaic system may be connected in series (for example in order to increase the voltage output from the gammavoltaic system) or in parallel (for example in order to increase the current output from the gammavoltaic system).

The plurality of DGV cells of the gammavoltaic system may be connected to one another using an electrical connector such as conductive paint or conducting wires.

Figure 7:
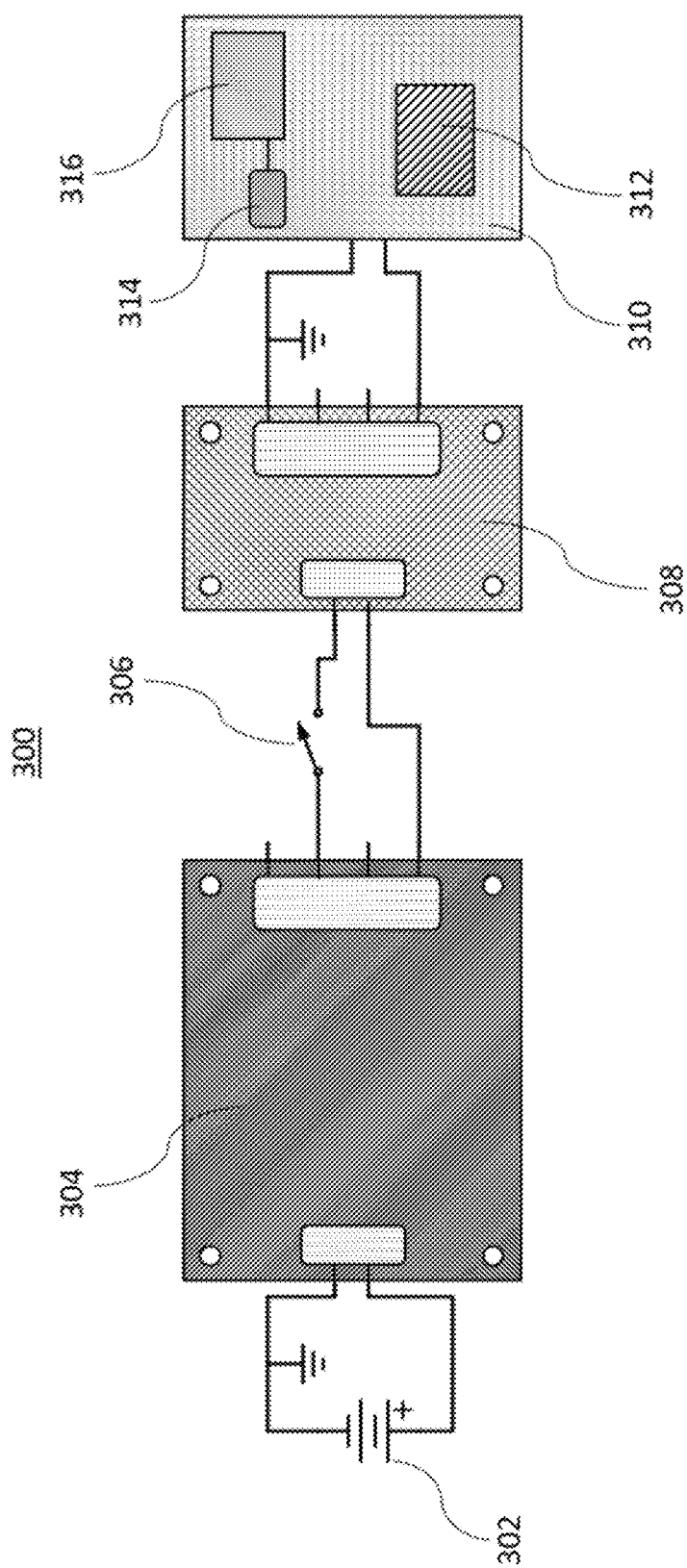
FIG. 7 shows a schematic of an example circuit, which may be connected to a DGV cell or a plurality of DGV cells according to the present invention.

FIG. 7 is a schematic diagram showing a circuit including a gammavoltaic system 302.

A Method of Generating Electricity

Provided herein is a method of generating electricity, the method comprising providing a diamond gammavoltaic device comprising a DGV cell and exposing the diamond gammavoltaic device to a to high-energy photons (for example, high-energy photons having an energy in the range of about 1 keV to about 5 MeV). In certain embodiments, the high-energy photons are provided by an x-ray emitting source or a gamma-emitting source.

Also described herein in the use of a diamond gammavoltaic cell, for example a DGV cell as described herein, as an electrical power provider in a circuit for monitoring nuclear activity.

It will also be understood that all the preceding configurations can be combined in a variety of different ways depending on application requirements.

EXAMPLES

Example 1

Production of Diamond Gammavoltaic Cell

An electronic-grade, single crystal diamond, with dimensions 4.5×4.5×0.5 mm, i.e. a surface area of 0.2 cm$^2$ (obtained from Element Six Ltd, Oxfordshire, UK), having a crystal orientation of [100], and very low nitrogen and boron impurities content (i.e. to the order of parts per billion, equivalent to ~$10^{14}$ cm$^{-3}$) was used.

The diamond was washed for 2 hours in aqua regia at 65° C., to remove any environmental contaminants and metal residues from prior use. 3.5×3.5 mm contacts were deposited, centrally located on opposing faces of the substrate. The contacts layers were different metals—aluminum and 80/20 nichrome—to introduce barrier asymmetry and hence a built-in voltage. The contact layers were capped with gold under the same vacuum, to avoid oxidation. Metals were deposited via physical vapor deposition using resistive thermal evaporation, through shadow masks, in an Edwards 306 Thermal Evaporator. The base pressure was ~4.5 mTorr (0.6 mPa). The substrate was heated to 250° C. during deposition and for one hour beforehand to remove adsorbed water, nitrogen and adventitious carbon. After deposition, the device was not annealed.

As a final cleaning and oxygen terminating step for the exposed surfaces of the device, a modified sputter coater (the "Terminator") was used, wherein a DC oxygen plasma was struck at ~3 kV and 1 Torr (133.3 Pa) for 30 s.

In this example, the diamond body surface was transfer doped via hydrogen termination. For hydrogen termination, the Terminator chamber (as used for final cleaning and oxygen terminating step) was then re-pumped and used to strike a hydrogen plasma, also at ~3 kV and 1 Torr (133.3 Pa) for 30 s. This created a surface hydrogen monolayer coverage $\Theta_H$≈0.3, as measured by X-ray photoemission spectroscopy as described in Mackenzie et al., "A diamond gammavoltaic cell utilizing surface conductivity and its response to different photon interaction mechanisms", Materials Today Energy 21 (2021) 100688 (https://doi.org/10.1016/j.mtener.2021.100688) and supporting information S1 (the contents of both are incorporated herein by reference in their entirety).

Example 2

Testing of the Diamond Gammavoltaic Cell

Figure 3:
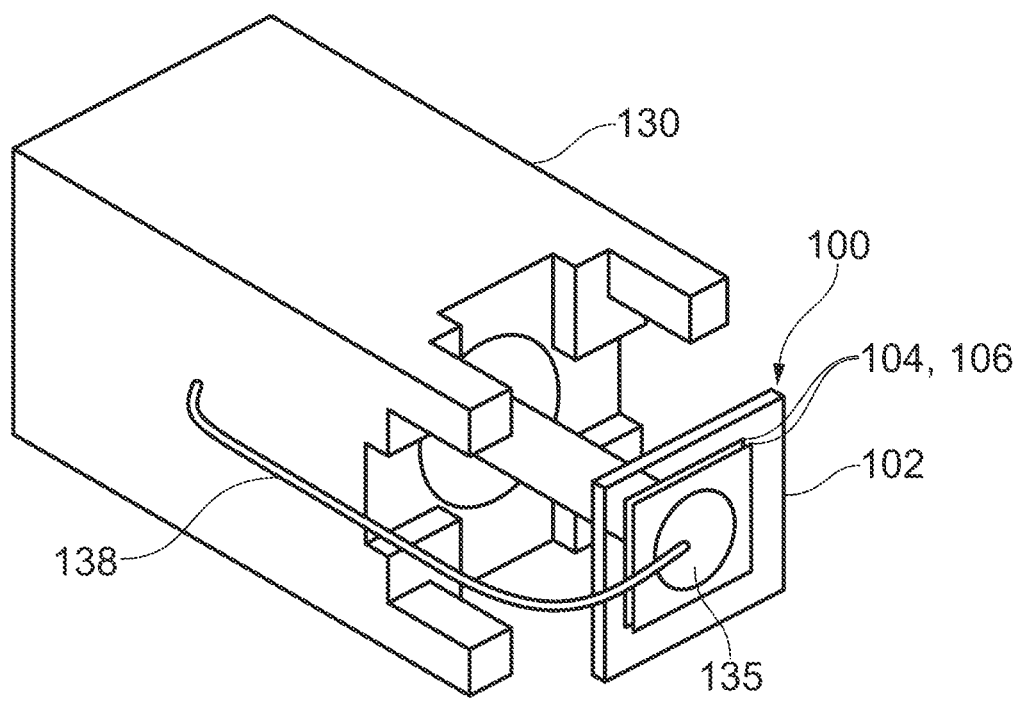
FIG. 3 is a picture of a gammavoltaic device comprising a gammavoltaic cell according to an aspect of the present disclosure.

A diamond gammavoltaic cell 100 with a diamond body 1 and low- and high-barrier contacts 104, 106 produced according to Example 1 was mounted onto an SMA head of a SMA connector 130 with silver conductive epoxy paint 135, the SMA connector 130 connected to the DVG cell via a wire core 138 as shown in FIG. 3. The assembly was left to dry, then baked in an oven at 120° C. for ten minutes, to cure the silver epoxy.

A Zeiss Xradia Versa 520 X-ray Tomography microscope (XRT) was used to test whether hydrogen termination is indeed necessary for creating a gammavoltaic effect, by illuminating the device as produced in Example 1 and a comparative device (a gammavoltaic cell produced as per Example 1 but without the final step of hydrogen termination). For these tests the X-ray source, which used a tungsten target and was unfiltered except by air, was set to 160 kV accelerating voltage and 9 W power. The characteristic emission lines of tungsten in this range are $K\alpha_2 \approx 58.0$ keV and $K\alpha_2 \approx 59.3$ keV.

I-V curves were taken in air, with the bias applied and the current measured with a Keithley 6517A multimeter. The bias was increased in increments of 0.05 V, between 0-0.55 V for the comparative device (a gammavoltaic cell produced as per Example 1 but without the final step of hydrogen termination), and between 0-1 V for the device produced according to Example 1. Ten (10) measurements were taken per increment. A 0.1 s dwell time was employed at the start of each increment to allow any capacitative effects to settle.

Figure 4:
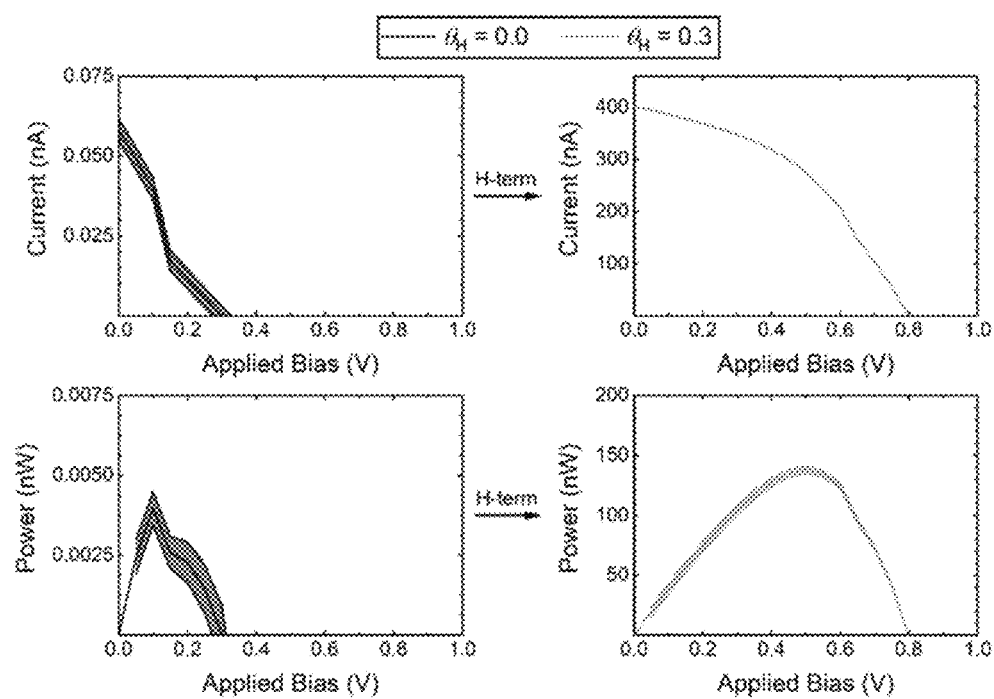
FIG. 4 shows graphs showing I-V data taken from a gammavoltaic device, driven by the XRT, with no hydrogen coverage $θ_H$=0.0, upper and lower left hand side graphs) and after partial hydrogen coverage $θ_H$≈0.3, upper and lower right hand side graphs)

I-V data taken from the device, driven by the XRT, with no hydrogen coverage ($\theta_H$=0.0, upper and lower left hand side graphs) and after partial hydrogen coverage ($\theta_H$=0.3, upper and lower right hand side graphs), are shown in FIG. 4. The device produced only a small gammavoltaic effect with no hydrogen coverage, generating currents of the order of 10 pA, in line with what would be expected from a monolithic insulating crystal. When the partial hydrogen termination was applied, the device showed a clear gammavoltaic effect, with a short-circuit current $I_{SC}$=0.4 μA, four orders of magnitude greater than the previous experiment, a $V_{OC}$=0.8 V and an FF=0.43±0.01.

The device comprising the DGV cell produced according to Example 1 was also tested using the Diamond Light Source (DLS) synchrotron, which allowed the DGV to be driven with a high-brightness beam of near-monochromatic X-rays, between 53.6-148.4 keV, of calculable flux. Measurements were performed with the beamline's Laue monochromator crystals unbent, to provide the narrowest possible photon energy bandwidth. After this, the energy was returned to a middle value, 81.1 keV, to seek evidence of damage or hysteresis. I-V curves were taken approximately 30 mins apart. Because it was desirable to keep the irradiated device surface area constant, the I-V curves were scaled to the flux at 53.6 keV: the current measured at each applied bias was multiplied by the ratio of the flux during that run, to the flux during the 53.6 keV run. No obvious damage occurred to the device during the DLS experiment.

Figure 5:
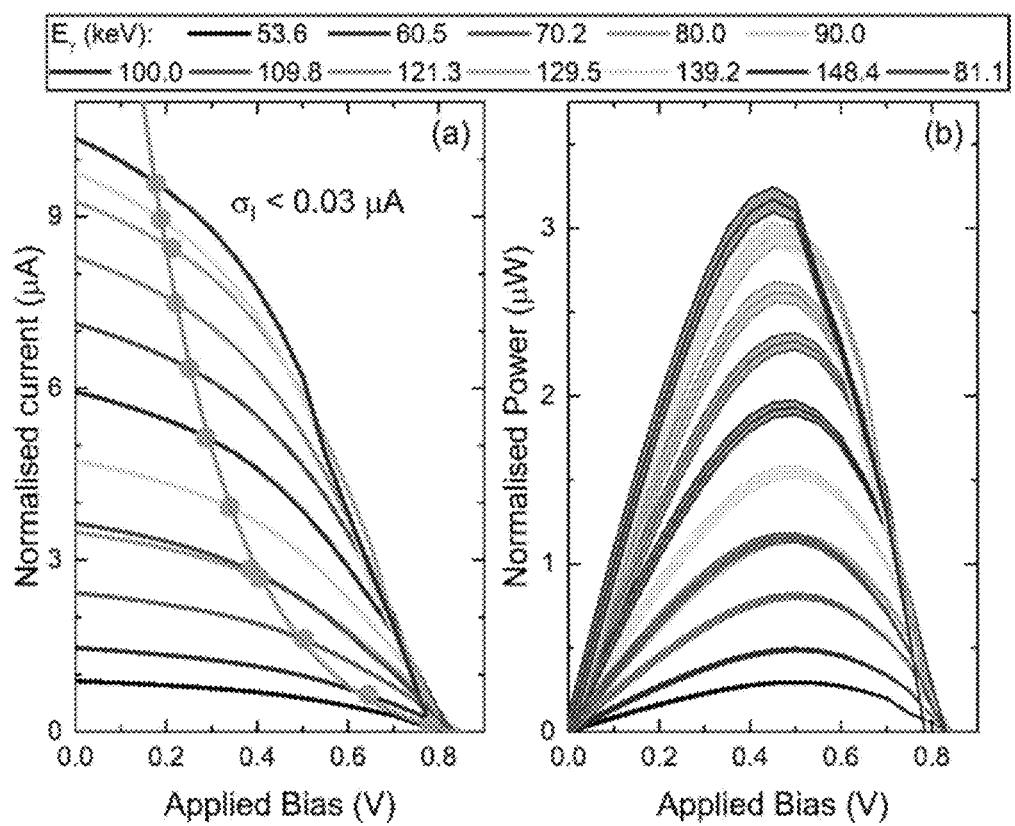
FIG. 5 shows graphs showing the I-V and associated P-V characteristics of a DGV cell produced according to an Example of the present invention.

FIG. 5 shows the I-V and associated P-V characteristics of the DGV cell produced according to Example 1 ($\theta_H \approx 0.3$), under irradiation from energies between approximately 50-150 keV at the DLS synchrotron. $\Delta I(\Delta V)$ points are also marked on the figure (green dots on left hand side graph), where $\Delta I = I_{SC} - \delta I$, $\delta I = 800$ nA and $\Delta V$ is the applied bias at which $\Delta I$ was measured. These points were used for resistance extraction, and were found to be well-fit by a phenomenological exponential function, $$\Delta I = A e^{-V/B} + C, \quad (1)$$

for which A=24±1 mA, B=200±7 mV, and C=−400±60 nA are fitting constants. The inverse of the derivative of this function was used to determine the changing series resistance of the device with incident photon energy.

The test of the comparative device (with full oxygen termination, i.e. before partial hydrogen termination) and after partial hydrogen termination ($\theta_H \approx 0.3$) demonstrated the effect of the present invention on providing an improved gammavoltaic device.

Figure 6:
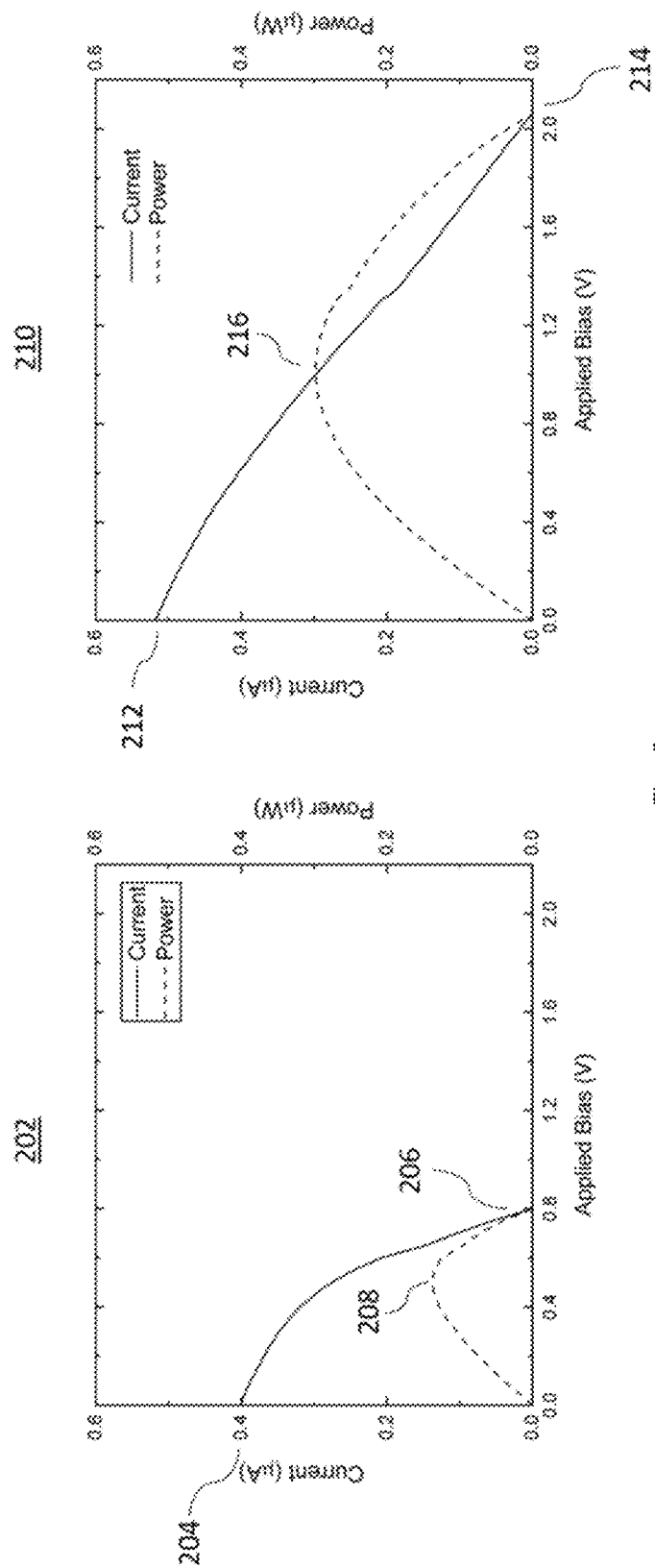
FIG. 6 shows graphs showing example I-V and P-V data when a single-celled device according to the present invention (left-hand side graph) and a device comprising 3 cells according to the present invention (right-hand side graph) are tested under irradiation from a laboratory x-ray source.

FIG. 6 shows examples of I-V and P-V data, for two cases (left- and right-hand side graphs) in which a device is tested under irradiation from a laboratory x-ray source. In both these cases, the devices were positioned adjacent to the emitting region of the x-ray source in an x-ray tomography microscope (XRT). The source was operating at a source voltage of 160 kV, and a source power of 9-10 W. The source operated via the Bremsstrahlung mechanism, using a W source (both $K\alpha \approx 60$ keV). The left-hand side graph of FIG. 6, 202, shows example I-V and P-V data which may be collected when exposing a single-celled device such as that produced according to Example 1 and shown in FIG. 2, showing 204 a short-circuit current $I_{SC}$=0.4 μA, 206 and open-circuit voltage $V_{OC}$=0.8 V, and 208 a maximum power-point $P_{MAX}$=0.14 μW. The right-hand side graph of FIG. 6, 210, is an example of data which may be collected when exposing a device comprising three cells, each cell of the device fabricated by the same means as described in Example 1, within the bounds of normal process variation. Within 210 is: 212 an $I_{SC}$=0.52 μA, 214 a $V_{OC}$=2.1 V, and 216 a $P_{max}$=0.3 μW.

FIG. 7 shows a schematic of an example circuit 300, which may be connected to a DGV cell (for example a cell produced according to Example 1) or plurality of DGV cells (for example a plurality of cells produced according to Example 1 and connected in series). In the circuit, the gammavoltaic device 302 acts as the energy source for an energy-harvesting module 304. For example, after 10 h of charging, the manual switch 306 may be closed, discharging the energy harvested into a voltage-boosting module 308. This powers a sensor/transmitter subcircuit 310 for long enough that a temperature reading may be taken and transmitted via Bluetooth. The subcircuit 310 comprises a power management integrated circuit (PMIC) 312, a temperature sensor 314, and a low-energy Bluetooth (BLE) transmitter 316.

Figure 8:
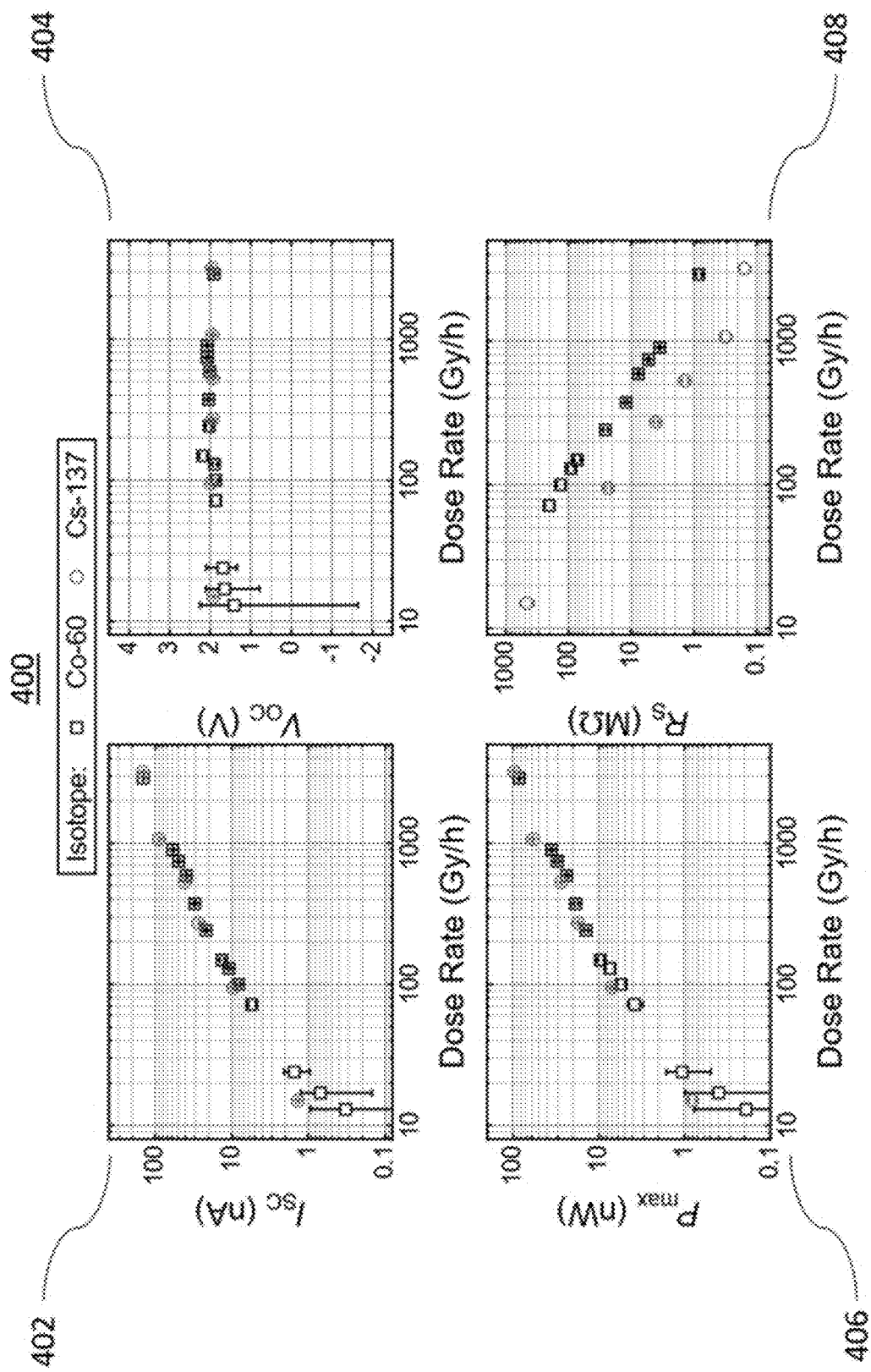
FIG. 8 shows graphs providing examples of data, which may be collected using a three-celled device according to the present invention.

FIG. 8 shows an example of data that may be collected using a three-celled device 400 (for example a plurality of cells produced according to Example 1 and connected in series). For this data, I-V curves were taken over a wide range of air kerma dose rates, from approximately 10-3000 Gy/h, using both Co-60 and $Cs^{-137}$ separately. These are gamma-emitting isotopes commonly found in nuclear waste. In this example, the $Cs^{-137}$ irradiations were performed in an irradiator, with different dose rates attained by altering the distance from the source to the device, whilst the Co-60 irradiations were performed in a cell-type facility, in which a combination of distance and the number of sources introduced was used to attain different dose rates. Dose rates were measured with a calibrated diamond dosimeter as described in Hutson, *Diamond-based dosimetry for measurements in highly radioactive nuclear environments*, University of Bristol (2018) and Hutson et al, Detection Apparatus, patent GB1703496.8-P130820GB00, (2017). Each I-V curve has been processed to extract pertinent parameters, which appear as subfigures: $I_{SC}$ in 402, $V_{OC}$ in 404, $P_{MAX}$ in 406, and series resistance $R_S$ in 408.

While the above provides examples of testing a diamond gammavoltaic device, such a device may be used in other examples, including those where the distribution and energies of emitted photons of gamma-radiation sources may be mixed or unknown.

While the methods, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the abovementioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality.

The features of any dependent claim may be combined with the features of any of the independent claims or other dependent claims.

Any operating parameters or component dimensions mentioned above are purely by way of example and may alter depending on operating conditions and use cases.

What is claimed is:

1. A diamond gammavoltaic device comprising:
a diamond body having a diamond body surface including first and second opposing surfaces;
a low-barrier electrical contact formed on the first surface; and
a high-barrier electrical contact formed on the second surface, wherein the high-barrier electrical contact has a higher electrostatic potential barrier than the low-barrier electrical contact,
wherein the diamond body surface that is not in contact with either the low-barrier electrical contact or the high-barrier electrical contact is at least partially surface transfer doped to provide a p-type surface.

2. The diamond gammavoltaic device according to claim 1, wherein the electrostatic potential between the high-barrier electrical contact and the low-barrier electrical contact is at least about 0.5 eV.

3. The diamond gammavoltaic device according to claim 1, wherein the diamond body surface that is surface transfer doped is hydrogen terminated.

4. The diamond gammavoltaic device according to claim 1, wherein at least 5% of the diamond body surface that is not in contact with either the low-barrier electrical contact or the high-barrier electrical contact is surface transfer doped to provide a p-type surface.

5. The diamond gammavoltaic device according to claim 3, wherein at least 5% of the diamond body surface that is not in contact with either the low-barrier electrical contact or the high-barrier electrical contact is hydrogen terminated.

6. The diamond gammavoltaic device according to claim 3, wherein at least 30% of the diamond body surface that is not in contact with either the low-barrier electrical contact or the high-barrier electrical contact is hydrogen terminated.

7. The diamond gammavoltaic device according to claim 1, wherein the low-barrier electrical contact and the high-barrier electrical contact are each formed of a different metal.

8. The diamond gammavoltaic device according to claim 1, wherein the diamond body has a thickness of at least about 0.2 mm.

9. The diamond gammavoltaic device according to claim 1, in which the low-barrier electrical contact and the high-barrier electrical contact are coated with a noble metal layer.

10. A method for generating electricity, the method comprising:
providing a diamond gammavoltaic device; and
exposing the diamond gammavoltaic device to high-energy photons,
wherein the diamond gammavoltaic device comprises:
a diamond body having a diamond body surface including first and second opposing surfaces;
a low-barrier electrical contact formed on the first surface; and
a high-barrier electrical contact formed on the second surface, wherein the high-barrier electrical contact has a higher electrostatic potential barrier than the low-barrier electrical contact,
wherein the diamond body surface that is not in contact with either the low-barrier electrical contact or the high-barrier electrical contact is at least partially surface transfer doped.

11. The method according to claim 10, wherein the high-energy photons have an energy in the range of about 1 keV to about 5 MeV.

12. The method according to claim 10, wherein the high-energy photons are provided by an x-ray emitting source or a gamma-emitting source.

13. A diamond gammavoltaic system comprising a plurality of diamond gammavoltaic cells, each diamond gammavoltaic cell comprising:
a diamond body having a diamond body surface including first and second opposing surfaces;
a low-barrier electrical contact formed on the first surface; and
a high-barrier electrical contact formed on the second surface, wherein the high-barrier electrical contact has a higher electrostatic potential barrier than the low-barrier electrical contact,
wherein the diamond body surface that is not in contact with either the low-barrier electrical contact or the high-barrier electrical contact is at least partially surface transfer doped.

14. The diamond gammavoltaic system according to claim 13, wherein the diamond body surface that is surface transfer doped is hydrogen terminated.

15. The diamond gammavoltaic system according to claim 13, wherein at least 5% of the diamond body surface that is not in contact with either the low-barrier electrical contact or the high-barrier electrical contact is surface transfer doped to provide a p-type surface.

16. The diamond gammavoltaic system according to claim 13, wherein at least 5% of the diamond body surface that is not in contact with either the low-barrier electrical contact or the high-barrier electrical contact is hydrogen terminated.

17. The diamond gammavoltaic system according to claim 13, wherein at least 30% of the diamond body surface that is not in contact with either the low-barrier electrical contact or the high-barrier electrical contact is hydrogen terminated.

* * * * *